United States Patent
Zhu et al.

(10) Patent No.: US 10,923,037 B2
(45) Date of Patent: Feb. 16, 2021

(54) GATE DRIVING CIRCUIT, METHOD FOR IMPLEMENTING GATE DRIVING CIRCUIT, AND METHOD FOR DRIVING GATE DRIVING CIRCUIT

(71) Applicant: BOE Technology Group Co., Ltd., Beijing (CN)

(72) Inventors: Jianchao Zhu, Beijing (CN); Libin Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/398,762

(22) Filed: Apr. 30, 2019

(65) Prior Publication Data
US 2020/0035166 A1    Jan. 30, 2020

(30) Foreign Application Priority Data

Jul. 27, 2018    (CN) .......................... 201810846883.6

(51) Int. Cl.
*G09G 3/3266*    (2016.01)
*G11C 19/28*    (2006.01)

(52) U.S. Cl.
CPC .......... *G09G 3/3266* (2013.01); *G11C 19/28* (2013.01); *G09G 2310/0286* (2013.01); *G09G 2320/0233* (2013.01)

(58) Field of Classification Search
CPC ......... G09G 3/3266; G09G 2310/0286; G09G 2320/0233; G09G 3/3208; G11C 19/28
See application file for complete search history.

(56) References Cited

U.S. PATENT DOCUMENTS 6,795,049 B2 *  9/2004  Toyoshima .......... G09G 3/3648
                                                     345/87
10,403,194 B2 *  9/2019  Li ........................ G09G 3/3266
(Continued)

FOREIGN PATENT DOCUMENTS

CN          202084307 U      12/2011
CN          105590601 A       5/2016
(Continued)

OTHER PUBLICATIONS

First Office Action, including Search Report, for Chinese Patent Application No. 201810846883.6 dated Oct. 9, 2019, 27 pages.

*Primary Examiner* — Amy Onyekaba
(74) *Attorney, Agent, or Firm* — Westman, Champlin & Koehler, P.A.

(57) ABSTRACT

The embodiments of the present disclosure disclose a gate driving circuit. The gate driving circuit includes at least one stage of shift register unit to be compensated, wherein a driving terminal of each stage of shift register unit to be compensated is connected to a gate line of a corresponding row of pixels to be compensated, and at least one stage of parasitics compensation circuit, wherein each stage of parasitics compensation circuit is connected in series between a power supply line and a driving terminal of a corresponding shift register unit to be compensated. Each stage of parasitics compensation circuit is configured to compensate a driving terminal of a corresponding shift register unit to be compensated for parasitic capacitance and/or parasitic resistance, so that respective stages of shift register units to be compensated have the same driving load.

12 Claims, 2 Drawing Sheets

(56) References Cited

U.S. PATENT DOCUMENTS

| | | | |
|---|---|---|---|
| 10,593,284 B2* | 3/2020 | Yang | G09G 3/20 |
| 2003/0020520 A1* | 1/2003 | Miyake | H03K 19/01714 |
| | | | 327/112 |
| 2005/0040889 A1* | 2/2005 | Tsuchi | H03F 3/45475 |
| | | | 330/255 |
| 2005/0057580 A1* | 3/2005 | Yamano | G09G 3/3283 |
| | | | 345/690 |
| 2005/0180083 A1* | 8/2005 | Takahara | H01L 51/5262 |
| | | | 361/152 |
| 2008/0129718 A1* | 6/2008 | Nishimura | G09G 3/3688 |
| | | | 345/205 |
| 2010/0060561 A1* | 3/2010 | Deane | G09G 3/3677 |
| | | | 345/100 |
| 2016/0210901 A1 | 7/2016 | Cha et al. | |
| 2016/0284297 A1* | 9/2016 | Cheng | G09G 3/3648 |
| 2017/0178583 A1* | 6/2017 | Zhang | G09G 3/3677 |
| 2018/0018918 A1* | 1/2018 | Miyake | G09G 3/3648 |
| 2018/0129106 A1 | 5/2018 | Gao et al. | |
| 2018/0166017 A1* | 6/2018 | Li | G09G 3/3233 |
| 2018/0342194 A1* | 11/2018 | Li | G09G 3/3677 |
| 2018/0366066 A1* | 12/2018 | Kim | G09G 3/3677 |
| 2019/0384478 A1* | 12/2019 | Teranishi | G06F 3/0412 |

FOREIGN PATENT DOCUMENTS

| | | |
|---|---|---|
| CN | 106448587 A | 2/2017 |
| CN | 106991990 A | 7/2017 |
| CN | 107424551 A | 12/2017 |
| CN | 107611142 A | 1/2018 |

* cited by examiner

US 10,923,037 B2

GATE DRIVING CIRCUIT, METHOD FOR IMPLEMENTING GATE DRIVING CIRCUIT, AND METHOD FOR DRIVING GATE DRIVING CIRCUIT

CROSS-REFERENCE TO RELATED APPLICATION(S)

This application claims priority to the Chinese Patent Application No. No. 201810846883.6, filed on Jul. 27, 2018, which is incorporated herein by reference in its entirety.

TECHNICAL FIELD

The present disclosure relates to the field of display technology, and more particularly, to a gate driving circuit, a method for implementing the gate driving circuit, a method for driving the gate driving circuit, an array substrate, and a display apparatus.

BACKGROUND

With the development of display technology, Organic Light Emitting Diode (OLED) display apparatuses are recognized as one of the most promising display apparatuses in the industry due to their advantages such as low weight, thinness, bright color, high contrast etc.

At present, in order to meet the diversified needs of users, display screens in the OLED display apparatuses have more and more diverse shapes, and there are some shaped display screens with special shapes such as a circle, an ellipse or a polygon etc. However, for a shaped display screen, respective rows of pixels usually have different numbers of pixel units provided therein. As a result, when different rows of pixels are driven by a gate driving circuit, there is a problem that pixels corresponding to different rows in the display screen are likely to have different brightness, which causes difficulty in maintaining consistent display brightness of respective rows of pixels of the shaped display screen.

SUMMARY

According to a first aspect of the embodiments of the present disclosure, there is provided a gate driving circuit, comprising:

at least one stage of shift register unit to be compensated, wherein a driving terminal of each stage of shift register unit to be compensated is connected to a gate line of a corresponding row of pixels to be compensated, and at least one stage of parasitics compensation circuit, wherein each stage of parasitics compensation circuit is connected in series between a power supply line and a driving terminal of a corresponding shift register unit to be compensated, wherein each stage of parasitics compensation circuit is configured to compensate a driving terminal of a corresponding shift register unit to be compensated for parasitic capacitance and/or parasitic resistance, so that respective stages of shift register units to be compensated have the same driving load.

In an embodiment, the gate driving circuit further comprises: a reference shift register unit cascaded with the at least one stage of shift register unit to be compensated, wherein a driving terminal of the reference shift register unit is connected to the power supply line and a gate line of a corresponding reference row of pixels respectively, and a number of pixel units in the reference row of pixels is greater than a number of pixel units in each row of pixels to be compensated.

In an embodiment, in a case where each stage of parasitics compensation circuit is used to compensate a driving terminal of a corresponding shift register unit to be compensated for parasitic capacitance, the parasitics compensation circuit comprises at least one compensation capacitor.

In an embodiment, in a case where the parasitics compensation circuit is used to compensate a driving terminal of a corresponding shift register unit to be compensated for parasitic resistance, the parasitics compensation circuit comprises at least one compensation resistor or at least one thin film transistor.

In an embodiment, in a case where the parasitics compensation circuit is used to compensate a driving terminal of a corresponding shift register unit to be compensated for parasitic capacitance and parasitic resistance, the parasitics compensation circuit comprises a load circuit formed by series-parallel connection of at least one compensation capacitor and at least one compensation resistor, or the parasitics compensation circuit comprises a load circuit formed by series-parallel connection of at least one compensation capacitor and at least one thin film transistor.

According to a second aspect of the embodiments of the present disclosure, there is provided a method for implementing the gate driving circuit according to the first aspect, comprising:

acquiring gate parasitics generated by a reference row of pixels and each row of pixels to be compensated among at least one row of pixels to be compensated;

determining, according to a difference in gate parasitics between each row of pixels to be compensated and the reference row of pixels, determining parasitic capacitance and/or parasitic resistance for which a corresponding shift register unit to be compensated connected to the row of pixels to be compensated needs to be compensated; and determining, according to the parasitic capacitance and/or the parasitic resistance for which the shift register unit to be compensated needs to be compensated, a structure of a parasitics compensation circuit corresponding to the shift register unit to be compensated, and connecting the parasitics compensation circuit in series between the power supply line and a driving terminal of the corresponding shift register unit to be compensated.

In an embodiment, the parasitics compensation circuit comprises a thin film transistor, and the step of determining a structure of a parasitics compensation circuit corresponding to the shift register unit to be compensated further comprises: determining a channel width to length ratio of a thin film transistor corresponding to the shift register unit to be compensated.

According to a third aspect of the embodiments of the present disclosure, there is provided a method for driving the gate driving circuit according to the first aspect, wherein the gate driving circuit comprises at least one stage of a shift register unit to be compensated, wherein a driving terminal of each stage of shift register unit to be compensated is connected to a gate line of a corresponding row of pixels to be compensated; and at least one stage of parasitics compensation circuit, wherein each stage of parasitics compensation circuit is connected in series between the power supply line and a driving terminal of a corresponding shift register unit to be compensated, the method for driving a gate driving circuit comprising:

outputting, by each stage of shift register unit to be compensated, a driving signal to a gate line of a corresponding row of pixels to be compensated by using parasitic capacitance and/or parasitic resistance compensated by a corresponding parasitics compensation circuit, so that respective shift register units to be compensated have the same driving load.

In an embodiment, when at least two rows of pixels to be compensated have the same number of pixel units, shift register units to be compensated corresponding to the at least two rows of pixels to be compensated are compensated for the same parasitic capacitance and/or parasitic resistance.

In an embodiment, before outputting, by each stage of shift register unit to be compensated, a driving signal to a gate line of a corresponding row of pixels to be compensated, the method further comprises:

selecting a row of pixels having the largest number of pixel units as a reference row of pixels, and selecting a row of pixels having a different number of pixel units from that in the reference row of pixels as a row of pixels to be compensated, wherein a reference shift register unit corresponding to the reference row of pixels needs not to be compensated for parasitic capacitance and/or parasitic resistance.

According to a fourth aspect of the embodiments of the present disclosure, there is provided an array substrate, comprising a display region and a non-display region, wherein the non-display region has the gate driving circuit according to the first aspect provided therein.

According to a fifth aspect of the embodiments of the present disclosure, there is provided a display apparatus, comprising the array substrate according to the fifth aspect.

BRIEF DESCRIPTION OF THE
ACCOMPANYING DRAWINGS

The accompanying drawings described herein are intended to provide a further understanding of the present disclosure, and constitute a part of the present disclosure. The illustrative embodiments of the present disclosure and description thereof are used to explain the present disclosure, and do not constitute an improper definition of the present disclosure. In the accompanying drawings.

DETAILED DESCRIPTION

In order to further explain the gate driving circuit, the method for implementing the gate driving circuit, the method for driving the gate driving circuit, the array substrate, and the display apparatus according to the embodiments of the present disclosure, description will be made in detail below with reference to the accompanying drawings.

For a shaped display, respective rows of pixels usually have different numbers of pixel units provided therein. If respective rows of pixels of the shaped display screen have different numbers of pixel units provided therein, gate parasitics generated by each row of pixels may be approximately proportional to a number of pixel units in the row of pixels, which is likely to cause respective rows of pixels to generate different gate parasitics, wherein each of the different gate parasitics comprises gate parasitic capacitance and gate parasitic resistance. Since respective stages of shift register units in the gate driving circuit have the same structure, that is, respective stages of shift register units have the same driving capability, when the gate driving circuit is used to drive different rows of pixels in the shaped display screen, respective shift register units in the gate driving circuit are used to drive different loads respectively, which may easily result in that different rising time or falling time is required when respective stages of shift register units drive the respective rows of pixels, that is, there may be a problem that it actually takes different time for respective stages of shift register units to write the same display data into the respective rows of pixels. Thereby, there is a problem that pixel units in different rows of pixels have different charging rates, which causes difficulty in maintaining consistent brightness of respective rows of pixels in the shaped display screen, thus causing difficulty in maintaining consistent display of the shaped display screen.

Figure 1:
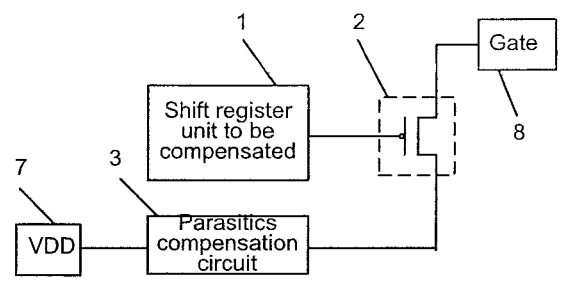
FIG. 1 is a schematic structural diagram of units of a gate driving circuit according to an embodiment of the present disclosure.
Figure 2:
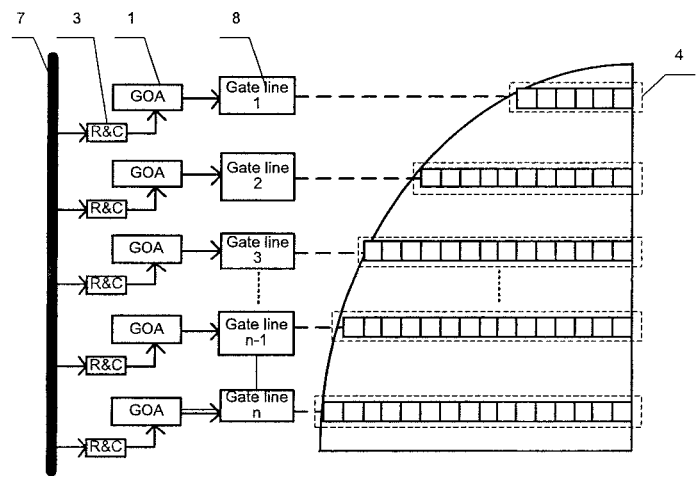
FIG. 2 is a schematic structural diagram of cascaded gate driving circuits according to an embodiment of the present disclosure.
Figure 3:
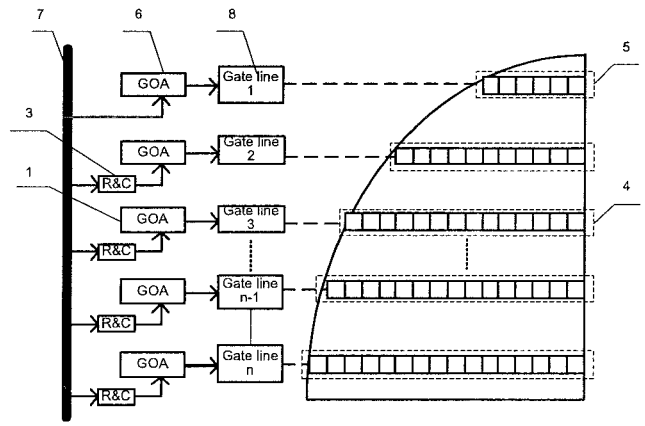
FIG. 3 is another schematic structural diagram of cascaded gate driving circuits according to an embodiment of the present disclosure.

Therefore, the embodiments of the present disclosure provide a gate driving circuit. As shown in FIGS. 1 to 3, the gate driving circuit comprises at least one stage of shift register unit 1 to be compensated, wherein a driving terminal 2 of each stage of shift register unit 1 to be compensated is connected to a gate line 8 of a corresponding row of pixels 4 to be compensated, and is also connected to a power source line 7 through a parasitics compensation circuit 3. The parasitics compensation circuit 3 is used to compensate the driving terminal 2 of the corresponding shift register unit 1 to be compensated for parasitic capacitance and/or parasitic resistance, so that respective stages of shift register units 1 to be compensated have the same driving load.

In the gate driving circuit according to the embodiment of the present disclosure, a parasitics compensation circuit 3 is provided between the power supply line 7 and a driving terminal 2 of each stage of shift register unit 1 to be compensated, and the parasitics compensation circuit 3 may be used to compensate the driving terminal 2 of the stage of shift register unit 1 to be compensated for parasitic capacitance and/or parasitic resistance on a side where the power supply line 7 is located, so as to ensure that respective stages of shift register units 1 to be compensated have the same driving load. Therefore, in a process of writing a driving signal into a corresponding row of pixels 4 to be compensated in each stage of shift register unit 1 to be compensated, respective stages of shift register units 1 to be compensated may have the same driving load, and therefore the same rising time or falling time is required when respective stages of shift register units 1 to be compensated drive the respective rows of pixels, that is, it actually takes the same time for respective stages of shift register units 1 to be compensated to write the same display data into the respective rows of pixels 4 to be compensated, so as to ensure that the pixel units in respective rows of pixels 4 to be compensated have the same charging rate, thereby ensuring that respective rows of pixels 4 to be compensated have the same brightness. In this way, it is ensured that respective rows of pixels of the shaped display screen have consistent display brightness, which results in consistent display.

It may be understood that, in respective rows of pixels of a shaped display screen, not all the rows of pixels need to be compensated for parasitic capacitance and/or parasitic resistance, that is, a row of pixels having the largest number or smallest number of pixel units is selected from respective rows of pixels of the shaped display screen as a reference row of pixels 5, and a row of pixels having a different number of pixel units from that in the reference row of pixels 5 is selected from respective rows of pixels of the shaped display screen as a row of pixels 4 to be compensated. Therefore, the gate driving circuit further comprises at least one stage of reference shift register unit 6 cascaded with the at least one stage of shift register unit 1 to be compensated, a driving terminal 2 of the reference shift register unit 6 is connected to the power supply line 7 and a gate line 8 of a corresponding reference row of pixels 5 respectively, and a number of pixel units in the reference row of pixels 5 is greater than or less than a number of pixel units in the row of pixels 4 to be compensated.

In a specific implementation, if a row of pixels having the largest number of pixel units among respective rows of pixels is used as the reference row of pixels 5, a row of pixels having the same number of pixel units as that in the reference row of pixels 5 may be regarded as the reference row of pixels 5, and needs not to compensated using a corresponding parasitics compensation circuit 3. Rows of pixels 4 to be compensated having the same difference in the number of pixel units as compared with the number of pixel units in the reference row of pixels 5 need to be compensated for the same parasitic capacitance and/or parasitic resistance. Thus, if at least two rows of pixels 4 to be compensated have the same number of pixel units, shift register units 1 to be compensated corresponding to the at least two rows of pixels 4 to be compensated should be compensated for the same parasitic capacitance and/or parasitic resistance.

It should be complemented that the reference shift register unit 6 and the shift register unit 1 to be compensated as described in the above embodiments belong to the same type of shift register units, and both have the same structure and functions. The shift register units are divided into reference shift register units and shift register units to be compensated only for the purpose of clearly illustrating a connection relationship among respective different structures in the above embodiments, that is, a shift register unit which needs not to be connected to a parasitics compensation circuit 3 is defined as a reference shift register unit 6, and a shift register unit which is connected to the power supply line 7 through a parasitics compensation circuit 3 is defined as a shift register unit 1 to be compensated, which does not have other substantial limitations.

In addition, respective rows of pixels in the shaped display screen may generate different gate parasitics, for example, different gate parasitic capacitance, or different gate parasitic resistance, or both different gate parasitic capacitance and different gate parasitic resistance. Correspondingly, if a parasitics compensation circuit 3 is only used to compensate a driving terminal 2 of a corresponding shift register unit 1 to be compensated with parasitic capacitance, the parasitics compensation circuit 3 should comprise at least one compensation capacitor; if the parasitics compensation circuit 3 is only used to compensate the driving terminal 2 of the corresponding shift register unit 1 to be compensated for parasitic resistance, the parasitics compensation circuit 3 should comprise at least one compensation resistor or at least one thin film transistor; and if the parasitics compensation circuit 3 is used to compensate the driving terminal 2 of the corresponding shift register unit 1 to be compensated for both parasitic capacitance and parasitic resistance, the parasitics compensation circuit 3 should comprise a load circuit formed by series-parallel connection of at least one compensation capacitor and at least one compensation resistor or a load circuit formed by series-parallel connection of at least one compensation capacitor and at least one thin film transistor.

It should be illustrated that the compensation capacitor is preferably a planar capacitor. Further, if the shift register unit 1 to be compensated needs to be compensated for small parasitic resistance, the parasitics compensation circuit 3 is preferably formed by a compensation resistor, which is generally formed by a metal trace; and if the shift register unit 1 to be compensated needs to be compensated for large parasitic resistance, the parasitics compensation circuit 3 is preferably formed by a thin film transistor. Output resistance of the thin film transistor may be adjusted by designing a channel width to length ratio of the thin film transistor, and the thin film transistor may have a less volume than that of a metal trace, which has the same resistance value as that of the thin film transistor, which is advantageous for reducing the space occupied by the parasitics compensation circuit.

Figure 4:
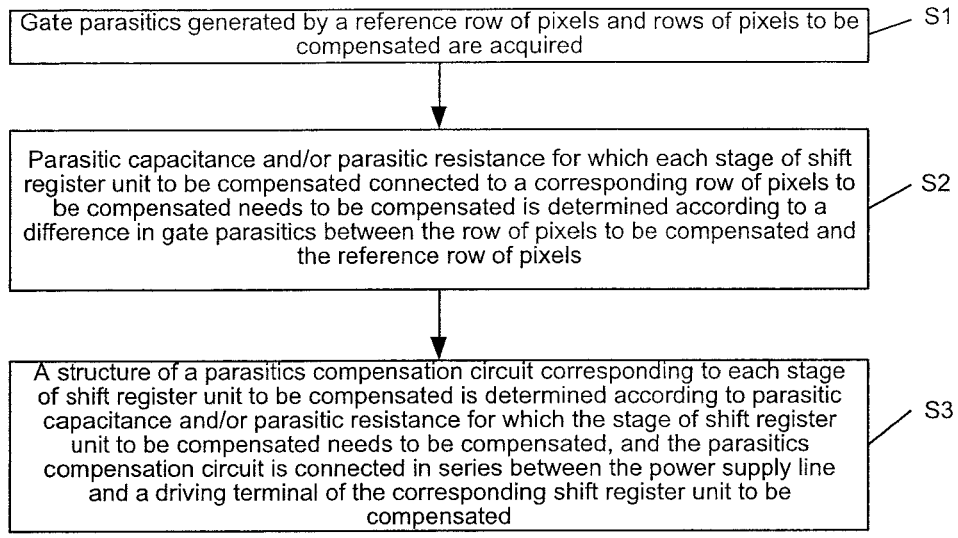
FIG. 4 is a schematic flowchart of a method for implementing a gate driving circuit according to an embodiment of the present disclosure.

The embodiments of the present disclosure further provide a method for implementing a gate driving circuit, which is used to implement the gate driving circuit according to the above embodiments. As shown in FIG. 4, the method for implementing a gate driving circuit comprises the following steps.

In step S1, gate parasitics generated by a reference row of pixels and rows of pixels to be compensated are acquired.

The above gate parasitics comprises gate parasitic resistance and gate parasitic capacitance. Gate parasitics generated by the reference row of pixels and gate parasitics generated by each row of pixels to be compensated refer to a sum of gate parasitics generated by respective pixel units in the corresponding row of pixels.

In step S2, parasitic capacitance and/or parasitic resistance for which each stage of shift register unit to be compensated connected to a corresponding row of pixels to be compensated needs to be compensated is determined according to a difference in gate parasitics between the row of pixels to be compensated and the reference row of pixels.

The difference in gate parasitics between each row of pixels to be compensated and the reference row of pixels may be only the difference in gate parasitic capacitance, or only the difference in gate parasitic resistance, or both the difference in gate parasitic capacitance and the difference in gate parasitic resistance.

In step S3, a structure of a parasitics compensation circuit corresponding to each stage of shift register unit to be compensated is determined according to parasitic capacitance and/or parasitic resistance for which the stage of shift register unit to be compensated needs to be compensated, and the parasitics compensation circuit is connected in series between the power supply line and a driving terminal of the corresponding shift register unit to be compensated.

If a shift register unit to be compensated only needs to be compensated for parasitic capacitance, a parasitics compensation circuit 3 provided in correspondence to the shift register unit to be compensated may be formed by at least one compensation capacitor. If the shift register unit to be compensated only needs to be compensated for parasitic resistance, the parasitics compensation circuit 3 provided in correspondence to the shift register unit to be compensated may be formed by at least one compensation resistor or at least one thin film transistor. If the shift register unit to be compensated needs to be compensated for both parasitic capacitance and parasitic resistance, the parasitics compensation circuit 3 provided in correspondence to the shift register unit to be compensated may be formed by series-parallel connection of at least one compensation capacitor and at least one compensation resistor, or formed by series-parallel connection of at least one compensation capacitor and at least one thin film transistor.

The beneficial effects which may be achieved by the method for implementing a gate driving circuit according to the embodiment of the present disclosure are the same as those which may be achieved by the gate driving circuit according to the above embodiments, and details thereof will not be described herein again.

It may be understood that if a shift register unit to be compensated needs to be compensated for small parasitic resistance, the parasitics compensation circuit is preferably formed by a compensation resistor, which is generally formed by a metal trace, and if the shift register unit to be compensated needs to be compensated for large parasitic resistance, the parasitics compensation circuit is preferably formed by a thin film transistor. In the present embodiment, if the determined parasitics compensation circuit 3 comprises a thin film transistor, in the above step S3, the step of determining a structure of a parasitics compensation circuit corresponding to each stage of shift register unit to be compensated further comprise: determining a channel width to length ratio of the thin film transistor corresponding to the stage of shift register unit to be compensated. In the method for implementing a gate driving circuit according to the present embodiment, output resistance of a thin film transistor may be adjusted by determining a channel width to length ratio of the corresponding thin film transistor. Since the thin film transistor may have a less volume than that of a metal trace, which has the same resistance value as that of the thin film transistor, if the parasitics compensation circuit is implemented using the thin film transistor in the present embodiment, it may realize reduction in the space occupied by the parasitics compensation circuit, which is beneficial for implementing miniaturization of the gate driving circuit. Of course, if the parasitics compensation circuit is formed by series-parallel connection of a compensation capacitor and a thin film transistor, both the channel width to length ratio of the thin film transistor and the compensation capacitor need to be determined accurately, so as to ensure that respective stages of shift register units to be compensated which have been compensated by the respective parasitics compensation circuits may have the same driving load, so that respective rows of pixels of the shaped display screen have consistent display.

Figure 5:
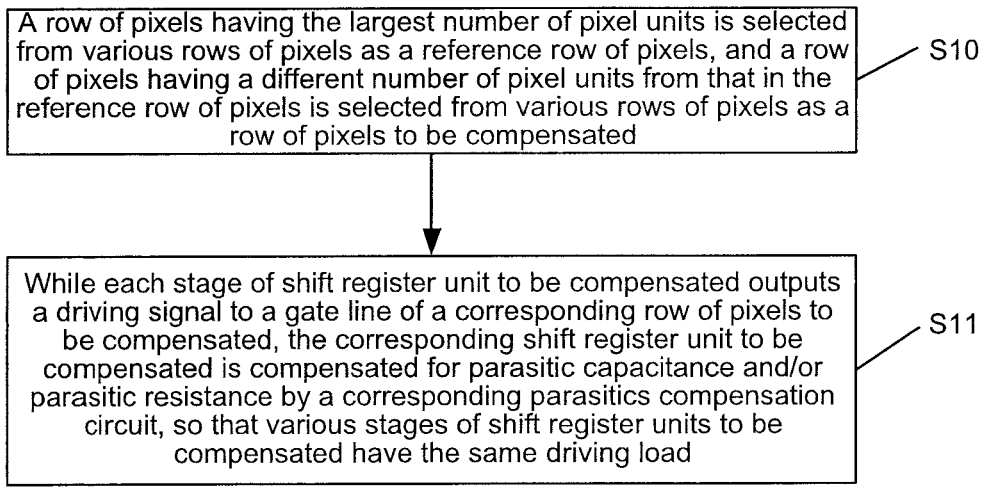
FIG. 5 is a schematic flowchart of a method for driving a gate driving circuit according to an embodiment of the present disclosure.

The embodiments of the present disclosure further provide a method for driving a gate driving circuit, so as to implement the gate driving circuit according to the above embodiments. As shown in FIG. 5, the method for driving a gate driving circuit comprises the following steps.

In step S11, while each stage of shift register unit to be compensated outputs a driving signal to a gate line of a corresponding row of pixels to be compensated, the corresponding shift register unit to be compensated is compensated for parasitic capacitance and/or parasitic resistance by a corresponding parasitics compensation circuit, so that respective stages of shift register units to be compensated have the same driving load.

The beneficial effects which may be achieved by the method for driving a gate driving circuit according to the embodiment of the present disclosure are the same as those which may be achieved by the gate driving circuit according to the above embodiments, and details thereof will not be described herein again.

It may be understood that in respective rows of pixels of the shaped display screen, not all the rows of pixels need to compensated for parasitic capacitance and/or parasitic resistance. Therefore, also as shown in FIG. 5, before step S11, the method for driving a gate driving circuit according to the embodiment of the present disclosure further comprises the following step.

In step S10, a row of pixels having the largest number of pixel units is selected from respective rows of pixels as a reference row of pixels, and a row of pixels having a different number of pixel units from that in the reference row of pixels is selected from respective rows of pixels as a row of pixels to be compensated, wherein a reference shift register unit for driving the reference row of pixels needs not to be compensated for parasitic capacitance and/or parasitic resistance.

In a specific implementation, if a row of pixels having the largest number of pixel units among respective rows of pixels is used as the reference row of pixels, a row of pixels having the same number of pixel units as that in the reference row of pixels may be regarded as the reference row of pixels, and needs not to compensated using a corresponding parasitics compensation circuit. Rows of pixels to be compensated having the same difference in the number of pixel units as compared with the number of pixel units in the reference row of pixels need to be compensated for the same parasitic capacitance and/or parasitic resistance. Thus, if at least two rows of pixels to be compensated have the same number of pixel units, shift register units to be compensated corresponding to the at least two rows of pixels to be compensated should be compensated for the same parasitic capacitance and/or parasitic resistance.

The embodiments of the present disclosure further provide an array substrate, which comprises a display region and a non-display region, wherein the non-display region has the gate driving circuit according to the above embodiments provided therein. The gate driving circuit in the array substrate has the same advantages as those of the gate driving circuit in the above embodiments, and details thereof will not be described herein again.

The embodiments of the present disclosure further provide a display apparatus, which comprises the array substrate according to the above embodiments. The array substrate in the display apparatus has the same advantages as those of the array substrate in the above embodiments, and details thereof will not be described herein again.

The display apparatus according to the above embodiments may be a product or component having a display function, such as a mobile phone, a tablet computer, a notebook computer, a display, a television, a digital photo frame, or a navigator etc.

The above description is only the specific embodiments of the present disclosure, but the protection scope of the present disclosure is not limited thereto. Changes or substitutions which are easily reached by any person skilled in the art within the technical scope of the present disclosure should be covered within the protection scope of the present disclosure. Therefore, the protection scope of the present disclosure should be determined by the protection scope of the claims.

We claim:

1. A gate driving circuit, comprising:
   at least one stage of shift register unit to be compensated, wherein a driving terminal of each stage of shift register unit to be compensated is connected to a gate line of a corresponding row of pixels to be compensated, and at least one stage of parasitics compensation circuit, wherein each stage of parasitics compensation circuit is connected directly in series between a power supply line and a driving terminal of a corresponding shift register unit to be compensated, wherein each stage of parasitics compensation circuit is configured to compensate a driving terminal of a corresponding shift register unit to be compensated for parasitic capacitance and/or parasitic resistance, so that respective stages of shift register units to be compensated have the same driving load.

2. The gate driving circuit according to claim 1, further comprising: a reference shift register unit cascaded with the at least one stage of shift register unit to be compensated, wherein a driving terminal of the reference shift register unit is connected to the power supply line and a gate line of a corresponding reference row of pixels respectively, and a number of pixel units in the reference row of pixels is greater than a number of pixel units in each row of pixels to be compensated.

3. The gate driving circuit according to claim 1, wherein in a case where each stage of parasitics compensation circuit is used to compensate a driving terminal of a corresponding shift register unit to be compensated for parasitic capacitance, the parasitics compensation circuit comprises at least one compensation capacitor.

4. The gate driving circuit according to claim 1, wherein in a case where the parasitics compensation circuit is used to compensate a driving terminal of a corresponding shift register unit to be compensated for parasitic resistance, the parasitics compensation circuit comprises at least one compensation resistor or at least one thin film transistor.

5. The gate driving circuit according to claim 1, wherein in a case where the parasitics compensation circuit is used to compensate a driving terminal of a corresponding shift register unit to be compensated for parasitic capacitance and parasitic resistance, the parasitics compensation circuit comprises a load circuit formed by series-parallel connection of at least one compensation capacitor and at least one compensation resistor, or the parasitics compensation circuit comprises a load circuit formed by series-parallel connection of at least one compensation capacitor and at least one thin film transistor.

6. A method for implementing the gate driving circuit according to claim 1, comprising:

acquiring gate parasitics generated by a reference row of pixels and each row of pixels to be compensated among at least one row of pixels to be compensated;

determining, according to a difference in gate parasitics between each row of pixels to be compensated and the reference row of pixels, determining parasitic capacitance and/or parasitic resistance for which a corresponding shift register unit to be compensated connected to the row of pixels to be compensated needs to be compensated; and determining, according to the parasitic capacitance and/or the parasitic resistance for which the shift register unit to be compensated needs to be compensated, a structure of a parasitics compensation circuit corresponding to the shift register unit to be compensated, and connecting the parasitics compensation circuit in series between the power supply line and a driving terminal of the corresponding shift register unit to be compensated.

7. The method according to claim 6, wherein the parasitics compensation circuit comprises a thin film transistor, and the step of determining a structure of a parasitic s compensation circuit corresponding to the shift register unit to be compensated further comprises: determining a channel width to length ratio of a thin film transistor corresponding to the shift register unit to be compensated.

8. A method for driving the gate driving circuit according to claim 1, wherein the gate driving circuit comprises at least one stage of a shift register unit to be compensated, wherein a driving terminal of each stage of shift register unit to be compensated is connected to a gate line of a corresponding row of pixels to be compensated; and at least one stage of parasitics compensation circuit, wherein each stage of parasitics compensation circuit is connected in series between the power supply line and a driving terminal of a corresponding shift register unit to be compensated, the method for driving a gate driving circuit comprising:

outputting, by each stage of shift register unit to be compensated, a driving signal to a gate line of a corresponding row of pixels to be compensated by using parasitic capacitance and/or parasitic resistance compensated by a corresponding parasitics compensation circuit, so that respective shift register units to be compensated have the same driving load.

9. The method according to claim 8, wherein when at least two rows of pixels to be compensated have the same number of pixel units, shift register units to be compensated corresponding to the at least two rows of pixels to be compensated are compensated for the same parasitic capacitance and/or parasitic resistance.

10. The method according to claim 8, wherein before outputting, by each stage of shift register unit to be compensated, a driving signal to a gate line of a corresponding row of pixels to be compensated, the method further comprises:

selecting a row of pixels having the largest number of pixel units as a reference row of pixels, and selecting a row of pixels having a different number of pixel units from that in the reference row of pixels as a row of pixels to be compensated, wherein a reference shift register unit corresponding to the reference row of pixels needs not to be compensated for parasitic capacitance and/or parasitic resistance.

11. An array substrate, comprising a display region and a non-display region, wherein the non-display region has the gate driving circuit according to claim 1 provided therein.

12. A display apparatus, comprising the array substrate according to claim 11.

\* \* \* \* \*